Sept. 6, 1966 J. E. ALLEGRETTI 3,271,208

PRODUCING AN N+N JUNCTION USING ANTIMONY

Filed Dec. 29, 1960

INVENTOR

JOHN E. ALLEGRETTI

United States Patent Office 3,271,208

Patented Sept. 6, 1966

3,271,208

PRODUCING AN N+N JUNCTION USING ANTIMONY

John E. Allegretti, East Brunswick, N.J., assignor to Merck & Co., Inc., Rahway, N.J., a corporation of New Jersey Filed Dec. 29, 1960, Ser. No. 85,173
2 Claims. (Cl. 148—175)

This invention relates to a single crystal semiconductor body comprising a plurality of layers of single crystal semiconductor material having different conductivities separated by a transition region, one layer of which is of low resistivity N conductivity type material and more particularly, it relates to a vapor deposition method for forming such semiconductor bodies wherein a layer of higher resistivity semiconductor material is deposited on a layer of low resistivity N semiconductor material.

Semiconductor devices comprising at least two layers of semiconductor material having different conductivities and separated by a transition zone have been well recognized in the art for the performance of an active function in an electrical circuit. To this point, there have been developed three methods of forming a transition zone, or junction, within a semiconductor body which are considered as being successful from a reproducible commercial standpoint. In all instances, for the most satisfactory semiconductor devices the starting material for the formation of a body containing a junction is a body of single crystal semiconductor material such as silicon, germanium or a compound of a Group III and a Group V metal such as gallium arsenide, indium phosphide, etc. The initial semiconductor body may be intrinsic, that is, not possessing appreciable active impurity atoms to impart to the body a specific type of electrical conductivity or, alternatively, the initial body may contain such active impurity atoms rendering thereto a predetermined electrical conductivity of either P or N type.

One common method of forming a P-N junction within such a semiconductor body is the alloying or fusion technique. In this process, a semiconductor body is contacted with a source of active impurity atoms as, for example, aluminum (in the case of silicon) or indium (in the case of germanium). A disk or pellet of aluminum is placed on a wafer of an N-type silicon semiconductor crystal. The assembly is then heated to a temperature above the eutectic temperature of aluminum and silicon but below the melting temperature of silicon. The body is then cooled and a P-type regrowth region of silicon containing the thermodynamic equilibrium solubility content of aluminum is formed. By this process the P-type regrown region is separated from the initial N-type body by a P-N junction. It may be seen that the alloy process has the limitation of not permitting control of the degree of conductivity of the regrowth region since the conductivity is fixed by the solid solubility of active impurity atoms in the regrown silicon region which, of course, is in turn determined by the segregation constant of silicon and aluminum.

The second common technique for the formation of junctions is known as the diffusion technique. In this instance, a solid or vapor source of active impurity atoms is placed in contact with the semiconductor body. The assembly is then heated to a high temperature but below the melting point of the semiconductor (i.e., heated to 1250° C. for silicon) and for a long period of time to cause the active impurity atoms to diffuse into the semiconductor body by physical migration and diffusion through the crystal lattice. The diffusion of the atoms follows a fixed distribution pattern with respect to the number of active impurity atoms present at any distance into the semiconductor body and the total distance for diffusion of any active impurity atoms. This distribution pattern has been established for known semiconductor materials with respect to known active impurity materials. The functional relation is described by Fick's law and by complementary error function curves for the respective materials at the temperatures involved. As may be appreciated, diffusion junctions have the disadvantage, in common with alloy junctions, that the number of active impurity atoms and position thereof within the semiconductor body are not variable at will since the active impurity atoms in a diffused junction must follow a physical distribution curve which is not within the control of the operator. This distribution curve also renders it difficult to accurately position a sharp transition region within the semiconductor body.

A third method of forming a junction within a semiconductor body is known as the grown junction technique. Unlike alloying and diffusion, in the grown junction technique the crystal of semiconductor material, together with occluded active impurity atoms, is formed from a molten mass thereof by pulling a single crystal by known techniques. At some stage of pulling the crystal, additional active impurity atoms of a type giving a conductivity of a type opposite to that in the initially formed crystal are added to the melt in quantities sufficient to change the conductivity type of the semiconductor body area next pulled from the melt. As is immediately apparent, the number of active impurity atoms added to the melt must be sufficient to compensate the number of opposite-type impurity atoms initially present in the melt and the formation of uncompensated conductivity layers is not possible after the first-formed layer. It is also apparent that the junction will be produced somewhere within a grown crystal transverse to the axis of formation thereof and requires special equipment to locate the junction at a desired point. Since relatively thin layers of semiconductor material of differing conductivities with a transition region therebetween are normally used for device manufacture considerable excess of semiconductor material is formed on either side of the junction, necessarily resulting in waste thereof. It is, therefore, apparent that this method of junction formation has not been commercially successful to any appreciable degree.

The foregoing methods of forming a transition region, e.g., the delineation between two layers of differing conductivities in degree, e.g., N+N, where N+ is a layer of low resistivity suitably 0.05 ohm-cm. or less, and N a layer of high resistivity suitably 1 ohm-cm. or greater, have been commonly employed in the formation of various structures, such as diodes, transistors, switches and the like. One of the important structures desired for fabrication is, for example, the structure commonly called an NPIN transistor. A common method of manufacturing such a device is to provide a wafer of relatively high resistivity N type semiconductive material, such as silicon. A P region is diffused into the top surface of such a wafer after suitable surface preparation by lapping, etching, etc., and thereafter an N layer is diffused into the thus-formed P layer. Ohmic contacts are made to the lower surface of the initial N wafer, which becomes the collector of the transistor; to the P layer, which is the base; and to the diffused N layer, which is the emitter. Conventionally, the NPIN nomenclature uses "I" (for "intrinsic") to designate the high resistivity wafer, and the last "N" of the nomenclature refers to the lower resistivity area at the surface or ohmic contact position on the original wafer. As may be appreciated, the original wafer to which the operations discussed above are applied must have substantial thickness merely for structural strength. This appreciable thickness is a detriment in the structure of an NPIN transistor since the thickness in what becomes the collector region causes undesirable series resistance in the structure. It is, of course, impossible, though obviously desirable, to provide an N+ wafer by diffusion or alloying techniques, then form a higher resistivity N layer above a lower resistivity N+ layer, and thereafter form the P and N layers comprising the base and emitter, respectively. Techniques of "out diffusion" by starting with an N+ wafer and removing some impurity atoms from the upper surface thereof to form an N layer have been tried without acknowledged success.

That the same problem of providing an N+ layer in a semiconductor body structure in a predetermined position therein is applicable to structures other than the NPIN transistor, is apparent. Also, it is highly desirable to provide methods for simultaneously forming one or a plurality of such semiconductor bodies by vapor deposition wherein a layer of high resistivity semiconductor material may be deposited from the vapor phase onto a layer of low resistivity material.

Accordingly, an object of the present invention is to provide a single crystal semiconductor body including a plurality of layers of single crystal semiconductor material having different conductivities and separated by a transition region wherein at least one of the layers is of low resistivity N conductivity type material.

Another object of the instant invention is to provide a single crystal semiconductor body including a plurality of layers of single crystal semiconductor material having different conductivities and separated by a transition region wherein one of the layers is doped with antimony to a predetermined low resistivity level.

Yet another object of the invention is to provide an N+N single crystal semiconductor body including two layers of single crystal semiconductor material of N conductivity type of different resistivities and separated by an abrupt transition region wherein the low resistivity N layer is appropriately doped with antimony.

A more specific object is to provide an N+N single crystal silicon semiconductor body including two layers of single crystal silicon semiconductor material of N conductivity type of different resistivities and separated by an abrupt transition region wherein the layer of lower resistivity is doped with antimony as a doping element to impart to the layer a resistivity of 0.05 ohm-centimeters or less and the layer of higher resistivity is appropriately doped to a resistivity level of 1 ohm-cm. or greater.

Still another object of the invention is to provide a method of forming by vapor deposition a single crystal semiconductor body having a plurality of layers of single crystal semiconductor material having different conductivities and separated by a transition region wherein there is included in said body at least one layer of low resistivity N conductivity type material which includes providing a single crystal semiconductor wafer having a surface layer of single crystal semiconductor material doped with antimony as an impurity element to impart to the layer a low resistivity N conductivity type and thereafter depositing from the vapor phase a single crystal semiconductor layer of high resistivity on said low resistivity layer.

A still more specific object of the instant invention is to provide a method of simultaneously forming by vapor deposition a plurality of N+N single crystal semiconductor bodies wherein the N+ layer of the body is doped to an appropriate low resistivity level with antimony as an impurity element and the high resistivity layer is deposited from the vapor phase onto said plurality of low resistivity layers.

Among the other objects of the invention is to provide a method of simultaneously forming by vapor deposition a plurality of N+N single crystal semiconductor bodies which includes providing a plurality of wafers of single crystal semiconductor material doped with antimony as a nonvolatile impurity element to impart to the wafer an N conductivity type with a resistivity of 0.05 ohm-cm. or less, heating the wafers and depositing from the vapor phase on said plurality of heated wafers, an N conductivity type single crystal semiconductor layer having a resistivity level of 1 ohm-cm. or greater, thereby forming a plurality of N+N semiconductor bodies.

These and other objects of the invention will become apparent from consideration of this disclosure read in conjunction with the accompanying drawings wherein.

Figure 1:
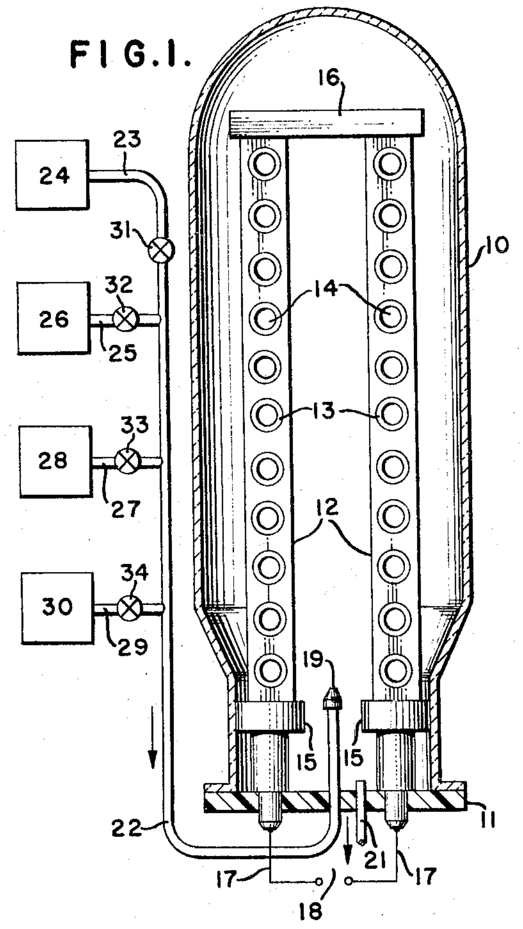
FIGURES 1 and 2 illustrate a suitable apparatus for carrying out the method of the present invention.

In accordance with the present invention there is provided a single crystal semiconductor body including a plurality of layers of single crystal semiconductor material having different conductivities separated by a transition region wherein one layer is of low resistivity N (or N+) conductivity type material doped with antimony as an impurity element. As an advantageous feature of the present invention, there is provided also a vapor deposition method for forming such semiconductor bodies wherein a layer of high resistivity semiconductor material is deposited on a layer of N+ semiconductor material.

In a preferred form of the invention there is obtained a method of simultaneously forming by vapor deposition a plurality of N+N single crystal silicon semiconductor bodies in which the N+ layer is provided as a substrate in the form of a heated wafer doped with antimony as the impurity element and in which method a high resistivity N layer is deposited thereon from the vapor phase.

This invention is based upon the discovery that a semiconductor layer of predetermined high resistivity may be deposited from the vapor phase onto a semiconductor layer of N conductivity type of predetermined low resistivity by utilizing a nonvolatile doping element in the low resistivity layer. Volatilization of the impurity atoms from the substrate layer is a detrimental phenomenon which arises from interaction between the semiconductor vapors above the substrate layer and the doping impurities in the substrate layer. Such interaction results in an excess concentration of impurity atoms in the vapor phase, thereby causing the resistivity of the vapor doped layer to fall below the desired high resistivity level. According to the present invention, however, antimony is such a nonvolatile N doping element. In contrast to similar doping with arsenic or phosphorus low resistivity N layers doped with antimony do not volatilize in the presence of semiconductor vapors. Therefore, by the method of the present invention, N layers having high resistivity, in the order of 1 ohm-cm. or greater, are formed on one or a plurality of low resistivity N substrates appropriately doped with antimony.

As used herein, the terms "thermally decomposable," "thermal decomposition" and the associated deposit of a product of decomposition, are intended to be generic to the mechanisms of heat-cracking as, for example, the decomposition of silicon tetrachloride and liberation of silicon atoms through the action of heat alone and the mechanism of high temperature reactions wherein the high temperature causes interaction between various materials with liberation of specific materials or atoms as, for example, the reaction of $$3SiHCl_3 + H_2 \xrightarrow{\Delta} 2Si + SiCl_4 + 5HCl$$

used in the preferred embodiments of this invention as hereinafter indicated.

While the invention is applicable to the preparation of a single wafer, it is highly desirable to provide a method for making a plurality of wafers simultaneously, thereby the accompanying description relates to the preparation of a plurality of semiconductor bodies. Also for the sake of illustration, the following detailed description of apparatus used and product obtained relates to the use of the invention in the formation of single crystal silicon semiconductor bodies.

Figure 2:
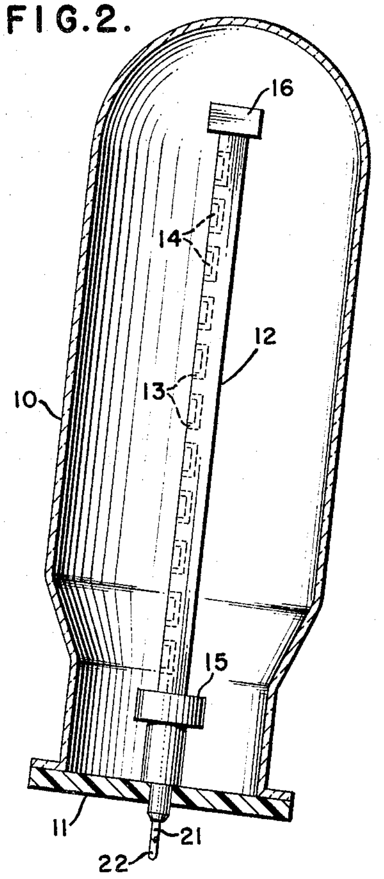

Referring particularly to FIGURES 1 and 2 there is schematically illustrated a suitable apparatus for use in this invention. Generally, there is presented in FIGURE 1 a bell jar 10 sealed to a base 11 in order to form a closed reaction chamber. An appropriate number of relatively high resistivity conducting supports 12, provided with sockets 13 for wafers 14, more particularly refined hereinafter, are mounted within the bell jar. Supports 12 are mounted within electrically conducting mounting chucks 15 at the lower end thereof and a conducting bridge 16 between the supports is provided. Leads 17 are attached to the electrically conductive chucks 15 and are provided with terminals 18 to which a source of electrical energy (not shown) may be connected to supply electric current flow through the supports 12 in order to heat them, as will be more fully described hereinafter. An entry port for reaction gases is provided by nozzle 19 which extends above the base 11 and into the interior of the reaction chamber formed by bell jar 10. An exhaust port 21 extends through base 11 in order to permit the removal of spent reaction gases from the chamber. Nozzle 19 is connected to conduit 22 extending through the base 11. Conduit 22 connects with the sources of vapors to be fed into the reaction chamber. Conduit 23 connects conduit 22 with a source of a carrier gas 24. Conduit 25 interconnects conduit 22 to a vapor source of semiconductor material 26. Conduit 27 interconnects conduit 22 with a vapor source of active impurity atoms 28 and conduit 29 interconnects conduit 22 with a source of flushing gas 30. Valves 31, 32, 33 and 34 are utilized to open or close each of the conduits individually, as will be more fully explained hereinafter.

It will be appreciated that the arrangement of apparatus illustrated in FIGURES 1 and 2 is substantially schematic for ease in understanding the process of this invention and that various assemblies of lines and valves for feeding reaction gases to the reaction chamber may be provided in many different configurations consistent with good engineering practices.

The procedure of the invention employing the apparatus of FIGURES 1 and 2 is as follows. The supports 12 to be used in the apparatus are prepared from electrically conductive material of high resistance which exhibits the characteristics of becoming heated due to the passage of electrical current therethrough. Materials such as silicon, conducting ceramics such as silicon carbide, graphite, refractory metals like tantalum, molybdenum or titanium may be employed. Obviously, the supports must be of a material which does not contain impurity atoms, or at least, does not interact with the system by introduction of impurity atoms. The dimensions of the supports should be adequate to enable sockets or receptacles for the wafers to be treated to be made in the surface of the support. As indicated in FIGURE 1, a plurality of such receptacles are normally used and the dimensions of the receptacles may be, for example, 1" in diameter and .050" in depth. The wafers 14 may be prepared in any suitable manner as, for example, by slicing or cutting wafers from commercially available zone refined single crystals of semiconductor material, both of which are known in the prior art. The wafers are cut in such a manner that the surface of the wafer to be treated is oriented in a specific crystallographic plane. In the preferred embodiments, the crystallographic plane on the surface of the wafer to be treated is a {111} plane. Other orientations of the planes on which growth will occur may be used, such as

{100} {110} {211}

The surface of the wafer on which growth will occur is carefully prepared by common techniques of grinding, polishing and etching.

Individual wafers are inserted in the receptacles therefor in the supports 13 and the supports mounted in the reaction chamber.

The supports 12 with wafers 14 positioned thereon are mounted in chucks 15 within the reaction chamber 10 and the electrically conducting bridge 16 is connected thereto. The supports are then heated by connecting the source of electrical energy (not shown) to terminals 18 so that current flow passes through the supports 12 and bridge 16. As the current flows through the supports 12, their temperature is raised. Since silicon has a negative resistance temperature coefficient, that is, a high resistance to passage of electrical energy (when cold), it is preferable to initially heat silicon supports, for instance with a source of radiant energy imported through the walls of the reaction chamber. For simplicity of illustration, such heating means are not illustrated in FIGURE 1.

Continued heating of the supports 12 causes heating of the wafers 14 through heat conductance. As may be appreciated, this mode of heating the wafers fulfills the important requirement that the wafers are heated uniformly within the reaction chamber.

Current flow is continued until the wafers are initially heated to a temperature of the order of about 1250° C. (all temperatures indicated herein were determined by optical pyrometer observation of the wafers.) At this point, valve 31 is opened and the carrier gas alone is permitted to flow through the conduits 23 and 22 through the nozzle 19 and into the interior of the reaction chamber 10 as a free jet of gas. This free jet principle of gas flow serves to provide substantial turbulence of gas in the reaction or vapor mixing chamber, a preferred process for the treatment of a plurality of wafers. Turbulent gas flow also may be effected by a mechanical gas stirrer or by maintaining the wall of the reaction chamber at a temperature which is considerably below the temperature of the support.

In the presently preferred embodiment of this invention wherein the formation of a silicon layer on the wafer is being described, the carrier gas is preferably hydrogen. At the temperature indicated, the hydrogen serves to cleanse the surface of the wafers, preparing them for single crystal growth. Regardless of the degree of care taken in the preparation of the initial seed crystals, it is believed that some oxidation of the surface thereof occurs from their exposure to the atmosphere and the flow of hydrogen gas at the temperature involved apparently removes these oxidized layers. Regardless of the theory involved, the surface treatment of silicon with hydrogen gas does enable subsequent single crystal growth.

After a period of time adequate to insure a clean surface, normally 30 minutes to an hour, the temperature of the wafers is adjusted to the temperture adequate to provide thermal decomposition of a vapor source of semiconductor atoms. In the presently preferred embodiment of this invention the source material for silicon atoms to be used in crystal growth is silicochloroform (trichlorosilane) although other halides such as silicon tetrachloride, silicon tetrabromide, etc. may be employed with appropriate adjustments made in temperature, gas mol ratios, flow rates, etc. The optimum temperature of the seed crystals when silicochloroform is used has been found to be approximately 1170° C. In further proceeding, the carrier gas, hydrogen, from its source 24 is mixed with the silicochloroform from source 26 by feeding the latter to conduit 22 through valve 32.

The hydrogen is admixed with silicochloroform and fed through conduit 22 into the reaction chamber 10 through the nozzle 19. At the same time, appropriate quantities of a vapor source of active impurity atoms are fed from source 28 and through conduit 27 and valve 33 to the flow of hydrogen and silicochloroform through conduit 22 in all instances where such impurities are desired in the layer being formed. All of the vapor feeding is, of course, controlled through the appropriate valves illustrated as controlling the respective feed lines. As will be appreciated, to ensure single crystallinity of the grown crystal from the thermally decomposable sources of semiconductor material and active impurity atoms there is required a balance between the temperature at the surface of the wafer, the flow rate of reaction gases through the chamber, and the mol ratios of vapors, i.e. the carrier gas, the vapor source of semiconductor atoms and the vapor source of active impurity atoms. Too low a concentration of vapor source for semiconductor atoms will result in low deposition rates, below those commercially practical. Too high or too low a temperature or too high a concentration of vapor source for semiconductor atoms will result in polycrystalline growth from temperature alone or too great a supply of semiconductor atoms deposited on the crystal, thereby preventing orientation of the atoms in an orderly arrangement thereof. The concentration of vapor source of active impurity atoms, while small in relation to the total gas flow, must be adequate to result in the desired conductivity in the formed crystal.

As heretofore indicated, a temperature of the seed crystal of the order of 1170° C. is optimum when used with a vapor of approximately 240 grams of silicochloroform per hour entrained in 5.5 liters per minute of total gas flow through the reactor. This mixture results in a mol ratio of silicochloroform to hydrogen of approximately 0.12, and variations of this mol ratio within a range of approximately 0.015 to 0.30 and preferably 0.06 to 0.20 may be employed in the case of silicochloroform and hydrogen. Under these temperature and flow rate conditions in the process described approximately 11 grams per hour of silicon is deposited. As is apparent, the amount of vapor source of active impurity atoms can be mathematically related to the silicochloroform weight introduced into the reaction chamber to obtain desired conductivities.

Gas flow into and through the reaction chamber is continued to form a layer of atoms of semiconductor material, silicon, and if desired, active impurity atoms (for example, boron, if P-type material is desired) in a crystalline relation resulting from the codeposition of the atoms as decomposition products of the vapor sources thereof in reaction contact with the then-existing crystalline surface.

Figure 3:
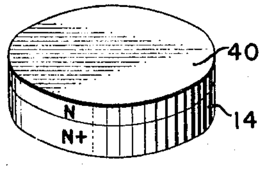
FIGURES 3 and 4 illustrate a semiconductor body formed in accordance with the method of the present invention.

Deposition is continued until the vapor-deposited layer 40 grows to the desired thickness, and the product exhibits the form illustrated in FIGURE 3. As hereinafter described, this product may be recovered and used for the manufacture of semiconductor devices. Alternatively, additional layers of differing conductivities may be formed on the wafer.

If a structure comprising a plurality of layers of in situ deposited conductivity layers is desired, the silicon wafers thus far formed, of the structure illustrated in FIGURE 3, are disassociated from any excess active impurity atoms present within the reaction chamber 11 and not within the structure of the crystals themselves. In the preferred embodiment, a gas flow procedure employing a vapor reactive with such impurities is employed. It is possible, of course, to remove the wafers thus formed to a second reaction chamber, although commercial consideration may dictate otherwise. This dissociation procedure is used in any instance where in the next-formed layer of semiconductor material a relatively low conductivity is desired. If high conductivity material is to be next formed on the crystal, the dissociation may be dispensed with since the number of active impurity atoms fed in the gas stream for deposition on the crystal to form the high conductivity layer will be in quantity adequate to overpower the characteristics which the excess impurity atoms left in the system might impart to the next-formed layer.

Additional layers of single crystal semiconductor material may be deposited on the thus-formed wafers in manner similar to that described above with respect to the first-formed layer. Appropriate changes will be made in the source of active impurity atoms from source 28 in either type of active impurity atoms or quantity thereof fed to the flowing reaction gas stream, or a combination of both, dependent upon the type of layer desired and the desired conductivity thereof.

The sources of active impurity atoms for depositing layers from the vapor phase are, as heretofore indicated, thermally decomposable volatile compounds of those elements which alter the intrinsic electrical properties of the semiconductor material by acting as donors or acceptors in semiconductor bodies. Ideal success has been had with the use of boron trichloride in the formation of P-type layers, and phosphorus trichloride in the case of N-type layers, and because of ease of handling these materials in the process, they are preferred for appropriate silicon doping of layers formed from the vapor phase in commercial embodiments of this invention.

As an example of a specific semiconductor body which may be formed in accordance with the present invention, an N+N wafer shown in FIGURE 3 may be formed as follows. A plurality of silicon wafers having an N-type conductivity of about 0.005 ohm-cm. (N+) are prepared by doping with antimony in an amount sufficient to impart the desired low resistivity to the wafer. Accordingly, about 10 g. of the metal is added in a melt of 50–100 g. of silicon and a single crystal pulled therefrom by zone refining techniques well known in the art. The thus doped single crystal is sliced into wafers and lapped, polished and etched to provide a clean surface for subsequent deposition thereon. Wafers having a diameter of approximately ¾ of an inch and a thickness of about 5 mils are prepared. The wafers are supported within the supports 12 which are, in turn, mounted in the reaction chamber 10 as shown. The wafers are heated at 1200° C. and initially treated by flowing carrier gas, in this case hydrogen, through nozzle 19 into the reaction chamber 10 at a rate of 5 liters per hour, for a period of about 30 minutes. Thereupon, a mixture of approximately 144 g. per hour of silicochloroform and 200 liters per hour of hydrogen carrier gas along with sufficient phosphorus trichloride to provide approximately $4 \times 10^{14}$ carriers per cc. of silicon is introduced into the reaction chamber. By maintaining the temperature at the surface of the silicon starting element at approximately 1170° C., a deposition rate of between 7 and 8 g. per hour of silicon along with atoms of phosphorus are deposited upon the silicon wafers. These conditions are maintained for approximately 5 minutes to produce a 12 micron thick layer upon the surface of the starting element. This layer of N-type single crystal silicon has a resistivity of approximately 8 ohm-cm. and is separated from the N+ layer formed by the original wafer by an abrupt transition region.

There is thus formed a plurality of N+N wafers as illustrated in FIGURE 3. From this wafer can be fabricated the NPIN transistor illustrated in FIGURE 4. The crystal body for such a device may be fabricated by diffusing a P layer into the vapor-deposited N layer by conventional diffusion techniques. For example, the wafer may be exposed to a vapor of hydrogen and $BCl_3$ for a period of approximately one hour at a temperature of 1100° C. A P-layer of 2–3 microns in thickness having a resistivity of 10 ohm-cm. will be thus formed. Subsequent fabrication of the device will be described hereinafter.

If it is desired that the P layer be provided on the crystal body in the form of a vapor-deposited conductivity layer, the wafer is not removed from the reaction chamber and growth of the wafer is continued in the following manner: after the deposition of the N layer, a mixture of reaction gas containing 240 g. per hour of silicochloroform with 330 liters per hour of hydrogen along with sufficient boron trichloride to provide $10^{15}$ carriers for cc. of silicon is introduced into the reaction chamber under the conditions as above outlined. This will provide a deposition rate of between 10 and 11 g. per hour. These conditions are maintained for approximately 3 minutes in order to provide a 2–3 micron thick layer of P-type semiconductor single crystal material having a resistivity of approximately 10 ohm-cm. This layer of single crystal P-type material is separated from the previously-deposited N-type layer of material by a very sharp, well-defined P-N junction.

The source of reaction gas is then removed from the reaction chamber and the wafers are permitted to cool at a rate of approximately 100° C. per minute after which they are removed from the reaction chamber.

Figure 5:
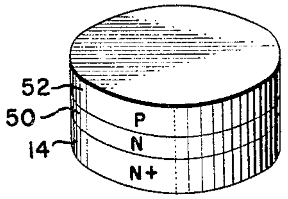
FIGURES 5 and 6 illustrate the formation of semiconductor elements from the semiconductor bodies formed in accordance with this invention.
Figure 6:
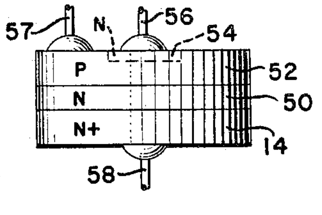
Figure 4:
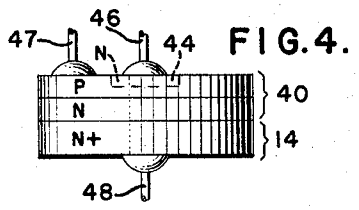

The wafers containing the original N+ layer, from the original wafer; the high resistivity N layer, from vapor deposition; and the P layer, either from diffusion into the crystal illustrated in FIGURE 3 or by a deposition thereof as illustrated in FIGURE 5, may be further fabricated to form the devices illustrated in FIGURES 4 and 6. The P layer is suitably masked and the wafer exposed to a vapor of arsenic for a period of approximately one hour at a temperature of 1100° C. With such treatment, the N regions, indicated as 44 in FIGURE 4 and 54 in FIGURE 6, will be formed in the P layer. Ohmic contacts are made to the thus formed N layers, 44 and 54, the P layer, and the N+ layer composed of the original wafer 14. The contacts are indicated as 46, 47 and 48, respectively, in FIGURE 4, and 56, 57 and 58 in FIGURE 6.

Structures formed, for example, as indicated in FIGURE 4, comprise an original N+ wafer having a resistivity of 0.05 ohm-cm. and a thickness of 5 mils, a vapor deposited N layer having a resistivity of 1–10 ohm-cm. and a thickness of 5–8 microns, a P layer by diffusion into the vapor deposited N layer of 10 ohm-cm. resistivity and a thickness of 2–3 microns, and an N layer diffused into part of the P layer having a resistivity of 0.05 ohm-cm. and a thickness of 1–2 microns. After suitable ohmic contacts were made as indicated, the device was tested.

By following the practice of the present invention, the width of the layers of semiconductor material and the location and type of the transition region may be very accurately defined and controlled.

As is apparent, any such semiconductor materials may be used where a vapor source of atoms of the semiconductor material and appropriate active impurity atoms therefor may be obtained. The vapor source must be capable of thermal decomposition and liberation of atoms of semiconductor material at the temperature to which the seed crystal upon which growth will occur may be heated, which temperature cannot exceed the melting point of the seed crystal or any deposited layer thereon. Consistent with these criteria, selection of an appropriate vapor source of the particular semiconductor material desired in any specific layer is possible. It is known, for example, that germanium crystals may be grown from vapors of germanium halides.

While we have described the invention with particular reference to the predetermined positioning of the low resistivity N layer as the surface layer in the semiconductor body, it is to be understood that the invention may be utilized to provide semiconductor body structures wherein the N+ layer is positioned intermediate in the body, wherein it is desired to isolate one active component of the composite structure from another.

What has been described herein is a single crystal semiconductor body and method for making the same wherein a predetermined single crystal semiconductor layer of high resistivity is deposited from the vapor phase onto a single crystal semiconductor layer of low resistivity N conductivity type. A particular advantage of the invention resides in the fact that the high resistivity of the vapor-deposited layer may be controlled entirely by the amount of impurities provided in the vapor phase with no detrimental influence being exerted by the impurities present in the low resistivity layer. These advantages are achieved herein by utilizing antimony as the doping impurity element in the low resistivity layer.

It will be appreciated that the foregoing description of this invention is detailed for the purpose of illustration but that the invention should not be considered limited to such detail and the scope of the invention should be construed only in accordance with the appended claims.

What is claimed is:

1. A method of forming by vapor deposition an N+N single crystal silicon semiconductor body including a substrate layer of single crystal silicon semiconductor material of N-conductivity type having a resistivity up to and including 0.05 ohm-cm. and a vapor-deposited single crystal silicon semiconductor layer of N-conductivity type having a resistivity of at least 1 ohm-cm. thereon, with an abrupt transition region therebetween, comprising the steps of:

(a) providing within a reaction chamber a single crystal silicon semiconductor substrate wafer of N-conductivity type doped with antimony as an impurity element to a resistivity level up to and including 0.05 ohm-cm., (b) heating said thus-doped wafer to a deposition temperature, (c) introducing into said chamber a decomposable vapor including a halogen-containing source compound of silicon semiconductor atoms, and N-conductivity type active impurity atoms therewith to impart a predetermined high resistivity of at least 1 ohm-cm. to said semiconductor atoms, and (d) contacting said heated wafer with said vapor thereby to form a single crystal N-conductivity type silicon layer on said low resistivity layer having a resistivity corresponding to said impurity atoms in said vapor, and an abrupt transition region between said low resistivity substrate and said high resistivity vapor-deposited layer.

2. A method of forming by vapor deposition an N+N single crystal silicon semiconductor body including a substrate layer of single crystal silicon semiconductor material of N-conductivity type having a resistivity of about 0.005 ohm-cm. and a vapor-deposited single crystal silicon semiconductor layer of N-conductivity type having a resistivity of about 8 ohm-cm. thereon, with an abrupt transition region therebetween, comprising the steps of:

(a) providing within a reaction chamber a single crystal silicon semiconductor substrate wafer of N-conductivity type doped with antimony to a resistivity level of about 0.005 ohm-cm., (b) heating said thus-doped wafer to a deposition temperature, (c) introducing into said chamber a decomposable vapor source of silicon semiconductor atoms including silicochloroform and hydrogen, and N-conductivity type active impurity atoms therewith to impart a predetermined high resistivity of about 8 ohm-cm. to said semiconductor atoms, and (d) contacting said heated wafer with said vapor thereby to form a single crystal N-conductivity type silicon layer on said low resistivity layer having a resistivity corresponding to said impurity atoms in said vapor, and an abrupt transition region between said low resistivity substrate and said high resistivity vapor-deposited layer.

References Cited by the Examiner

UNITED STATES PATENTS

| | | | |
|---|---|---|---|
| 2,692,839 | 10/1954 | Christensen et al. | 148—1.5 |
| 2,763,581 | 9/1956 | Freedman | 148—1.5 |
| 2,895,858 | 7/1959 | Sangster | 148—1.5 |
| 2,910,394 | 10/1959 | Scott et al. | 148—1.5 |
| 2,931,958 | 4/1960 | Arthur et al. | 148—33 |
| 3,046,459 | 7/1962 | Anderson et al. | 148—33 |
| 3,131,098 | 4/1964 | Krsek et al. | |

FOREIGN PATENTS

| | | |
|---|---|---|
| 1,029,941 | 5/1958 | Germany. |

DAVID L. RECK, *Primary Examiner.*

MARCUS U. LYONS, BENJAMIN HENKIN, *Examiners.*

C. N. LOVELL, M. CIOMEK, N. F. MARKVA, *Assistant Examiners.*